United States Patent
Kobrinsky et al.

(10) Patent No.: US 6,870,270 B2
(45) Date of Patent: Mar. 22, 2005

(54) METHOD AND STRUCTURE FOR INTERFACING ELECTRONIC DEVICES

(75) Inventors: Mauro J. Kobrinsky, Hillsboro, OR (US); R. Scott List, Beaverton, OR (US); Sarah E. Kim, Portland, OR (US); Michael C. Harmes, North Plains, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/334,172

(22) Filed: Dec. 28, 2002

(65) Prior Publication Data

US 2004/0232537 A1 Nov. 25, 2004

(51) Int. Cl.$^7$ .......................... H01L 23/48; H01L 23/52; H01L 29/40
(52) U.S. Cl. ...................... 257/777; 257/780; 257/786; 438/613
(58) Field of Search ................................ 257/780, 781, 257/777, 786, 778; 438/455, 613, 615

(56) References Cited

U.S. PATENT DOCUMENTS

| | | | |
|---|---|---|---|
| 6,005,292 A | * | 12/1999 | Roldan et al. |
| 6,216,941 B1 | * | 4/2001 | Yokoyama et al. |
| 6,495,397 B2 | * | 12/2002 | Kubota et al. |
| 6,555,917 B1 | * | 4/2003 | Heo |

* cited by examiner

Primary Examiner—S. V. Clark
(74) Attorney, Agent, or Firm—Blakely, Sokoloff, Taylor & Zafman LLP (57) ABSTRACT

Method and structure for optimizing and controlling diffusional creep at metal contact interfaces are disclosed. Embodiments of the invention accommodate height variations in adjacent contacts, decrease planarization uniformity requirements, and facilitate contact bonding at lower temperatures and pressures by employing shapes and materials that respond predictably to compressive interfacing loads.

26 Claims, 12 Drawing Sheets

METHOD AND STRUCTURE FOR INTERFACING ELECTRONIC DEVICES

BACKGROUND OF THE INVENTION

Integrated circuits (ICs) form the basis for many electronic systems. An integrated circuit (IC) generally comprises a vast number of transistors and other circuit elements that are formed on a single semiconductor wafer or chip and are interconnected to implement a desired function. The complexity of these ICs requires the use of an ever increasing number of linked transistors and other circuit elements.

As IC technology progresses, there is a growing desire for a "system on a chip" in which the functionality of all of the IC devices of the system are packaged together without a conventional printed circuit board. In practice, however, it is very difficult to implement a truly high-performance "system-on-a-chip" due, in part, to process and structure limitations for pertinent logic and memory circuits.

As intermediate solutions between system-on-a-chip and more traditional independent chip integrations, various "system modules" have been introduced that electrically connect and package IC devices which are fabricated on the same or on different semiconductor wafers. Initially, system modules have been created by simply stacking two chips, e.g., a logic and memory chip, one on top of the other in an arrangement commonly referred to as chip-on-chip structure. The two chips may be electrically connected using wire bonding techniques. Subsequently, multi-chip module (MCM) technology has been utilized to stack a number of chips on a common substrate to reduce the overall size and weight of the package, which directly translates into reduced system size.

Existing MCM technology is known to provide performance enhancements over single chip or chip-on-chip (COC) packaging approaches for some applications. For example, when several semiconductor chips are mounted and interconnected on a common substrate through wire bonding, very small form factors may be achieved, which may lead to reduced weight and volume for an equivalent level of performance. However, MCM approaches still suffer from additional problems, such as bulky package and wire bonding that gives rise to stray inductances that significantly degrade the operation of the system module, make power distribution challenging, and may limit its use to lower power applications that require low communication bandwidth between the chips.

Advanced three-dimensional (3D) wafer-to-wafer vertical stack technology is being developed to realize more ideal "system on a chip" performance. In addition, it is expected to deliver a higher performance for the same power and chip size by reducing the length of the interconnects within the chip, which decreases the so-called RC delays. Furthermore, 3D wafer-to-wafer bonding enables the integration of otherwise incompatible technologies. Early disclosures of related technologies include *"Face To Face Wafer Bonding For 3D Chip Stack Fabrication To Shorten Wire Lengths"* by J. F. McDonald et al., Rensselaer Polytechnic Institute presented on Jun. 27–29, 2000 VMIC Conference, and *"Copper Wafer Bonding"* by A. Fan et al., Massachusetts Institute of Technology, Electrochemical and Solid-State Letters, 2 (10) 534–536 (1999). In contrast to the existing MCM technology which seeks to stack multiple chips on a common substrate, 3-D wafer-to-wafer vertical stack technology involves vertically stacking many layers of active IC devices such as processors, programmable devices and memory devices inside a single chip to shorten average wire lengths, thereby reducing interconnect RC delay and increasing system performance.

One major challenge of 3-D wafer-to-wafer vertical stack integration technology is the bonding between wafers and between die in a single chip. In particular, a key challenge is ensuring that interfaced contact points do indeed form viable electronic contacts without gaps or shorts to adjacent contacts. FIGS. 1A–1D are useful for illustrating this challenge.

Figure 1A:
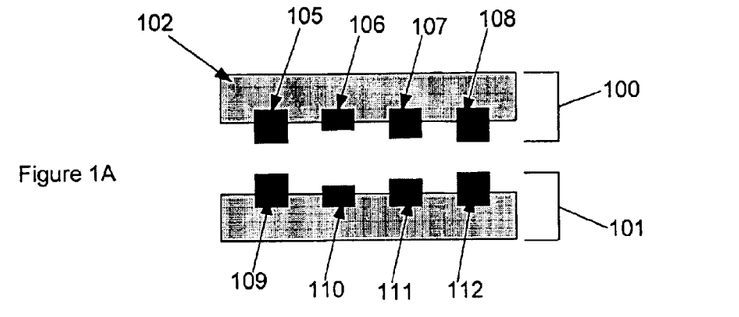
FIGS. 1A–1D depict cross sectional views of two contact substrates of an embodiment of the present invention during various phases of interfacing.

Referring to FIG. 1A, a contact substrate (100) comprising a substrate layer (102) and a series of contacts (105–108) opposes a second contact substrate (101) with similar contacts (109–112). As can be seen in the depicted illustration, the contacts do not protrude from the respective substrates by equal distances or "protrusion heights". Referring to FIG. 1A, for example, is apparent that contact line 106 has a smaller protrusion height than contact 108. The amount of standard deviation from a mean protrusion height can be represented by the statistical value known as variance, which is well known convention. Since the contacts to be interfaced (105–112) do not have precisely equivalent protrusion heights, the grouping has a nonzero protrusion height variance. Such a scenario is quite typical in semiconductor processing due to systemic inaccuracies related to conventional processes such as chemical vapor deposition (CVP), physical vapor deposition (PVD), spin-on techniques, electroplating, and chemical mechanical planarization (CMP). To facilitate suitable electrical contact formation between pairings of contacts (105 and 109, 106 and 110, 107 and 111, 108 and 112, for example), compressive loading at elevated temperatures to facilitate diffusional creep may be employed.

Figure 1B:
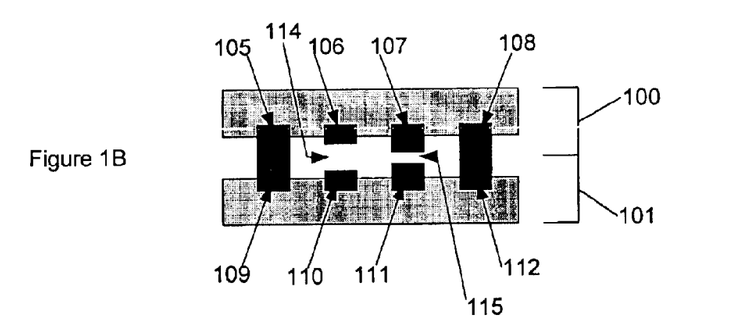
Figure 1C:
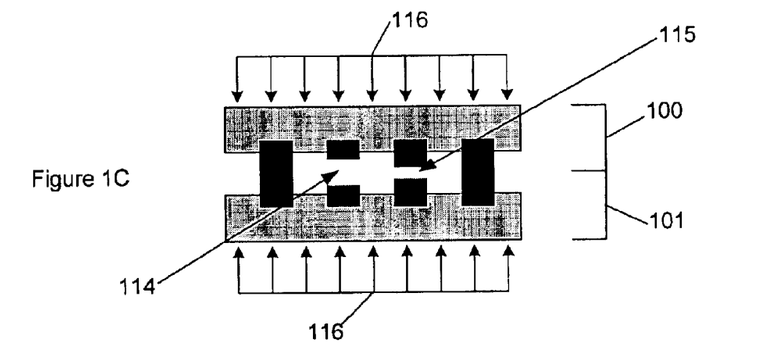
Figure 1D:
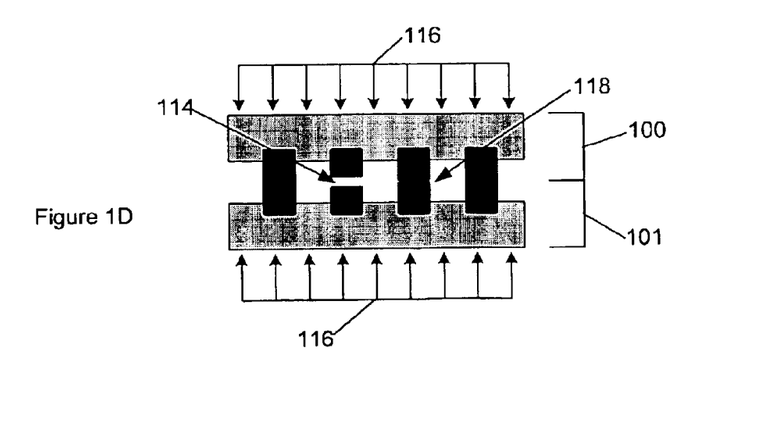

Referring to FIG. 1B, the two contact substrates have been positioned opposite each other with substantially no compressive load, and it is apparent that, due to the nonzero contact protrusion variance, undesirable gaps (114, 115) are present. Referring to FIG. 1C, a substantially distributed compressive load (116) is applied to urge the first (100) and second (101) contact substrates toward each other. Given proper loading, materials selection and dimensioning, and temperature, diffusional creep, the migration of atoms from regions of higher stress to regions of lower stress by diffusion, may help to mitigate the gapping problem. As shown in FIG. 1D, atoms from the more highly compressively loaded contacts (105 and 109, 108 and 112, in FIGS. 1A and 1B) have migrated from the contact interface to lower stress regions, such as sidewalls of the contacts, to bridge (118) one of the regions of previous gapping (115), while the other gap (114) remains. The reliability with which contacts are properly interfaced has a significant effect upon the bandwidth of communication between active layers. Low reliabilities, for example, may directly translate into undesirably low bandwidths.

There is a need for optimized process and structure for controllably encouraging diffusional creep to facilitate desired contact patterns between devices.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 2A:
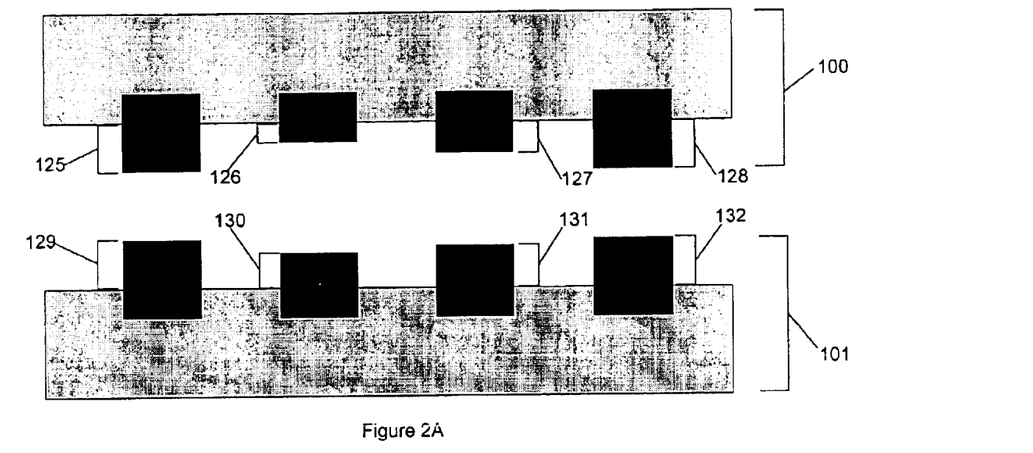
FIGS. 2A–2B depict close-up cross sectional views of pairs of contact substrates of an embodiment of the present invention in two phases of interfacing.

Referring to FIG. 2A, two contact substrates (100, 101) are depicted opposed from each other. The contact substrates (100, 101) are depicted in this and other figures with four pairs of contacts and without other structures associated for simplicity of illustration purposes. It should be clear that other structures such as conductive layers, dielectric layers, trenches, etcetera may comprise or be in contact with the contact substrates (100, 101), and that more or fewer pairs of contact lines may be appropriate, as would be apparent to those skilled in the art. Further detail regarding the makeup of a contact substrate embodiment is discussed in reference to FIGS. 4A–4G.

The depicted pair of contact substrates (100, 101) has a nonzero contact protrusion height variance, as evidenced by the unequal protrusion heights (125–132) apparent in the illustration. Variance is conventionally calculated using the following formula for a population.

$$\sigma_X^2 = \frac{\left(\sum_{i=1}^{N} X_i^2\right) - \frac{\left(\sum_{i=1}^{N} X_i\right)^2}{N}}{N-1}$$

In the depicted example, N for the system of both contact substrates (100, 101) would be 8, and "Xi" would represent a particular contact line protrusion height.

Figure 2B:
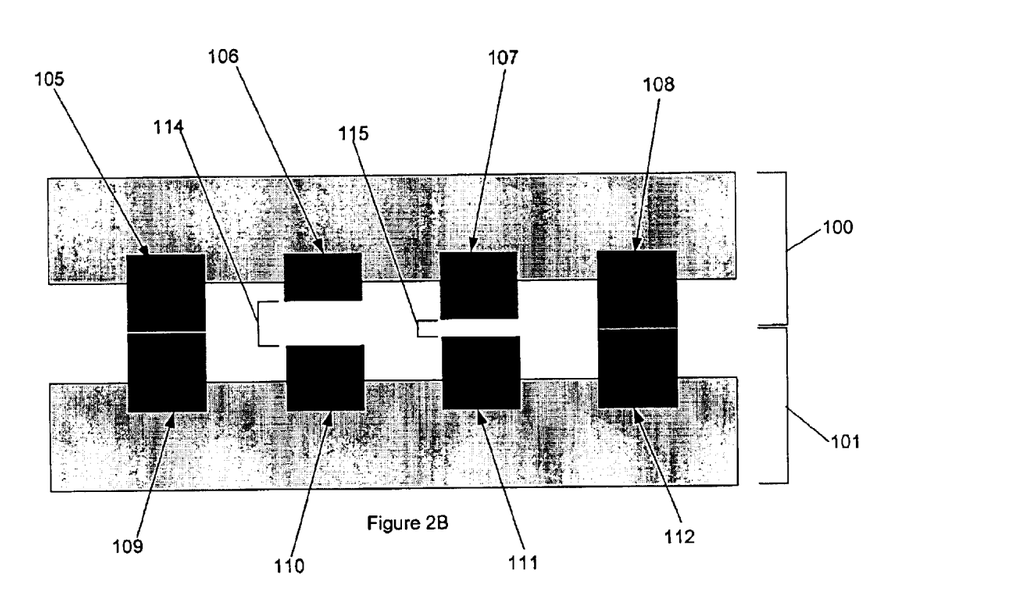
Figure 3A:
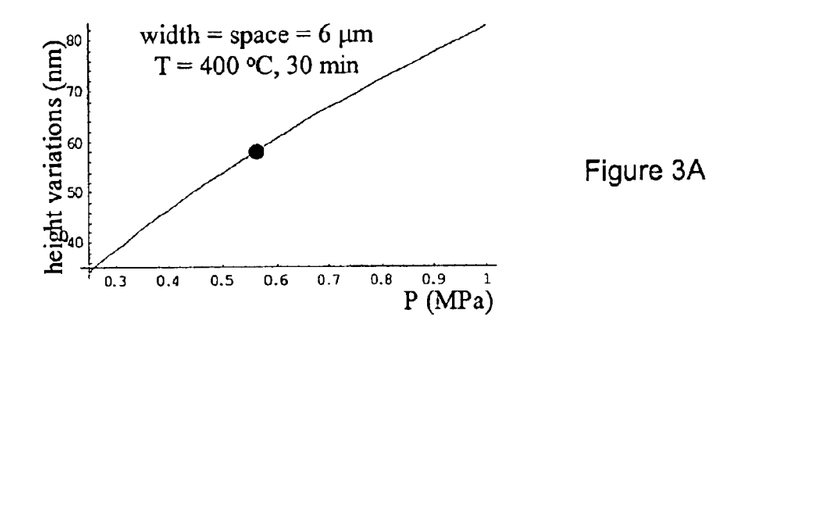
FIGS. 3A–3C depict height variation, or protrusion variance, relationships versus pressure, contact width, and temperature, respectively, for one embodiment of the present invention.
Figure 3B:
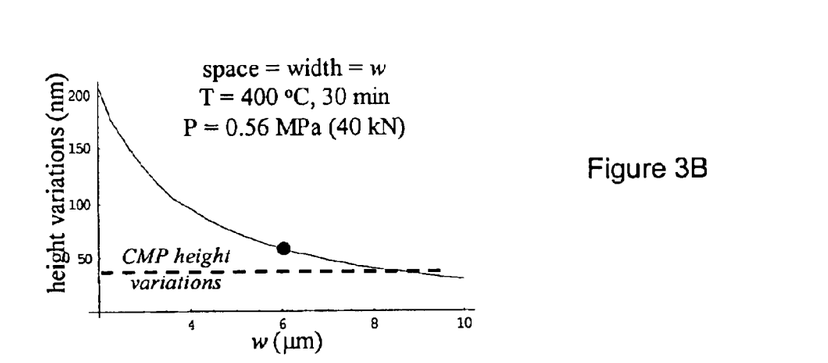
Figure 3C:
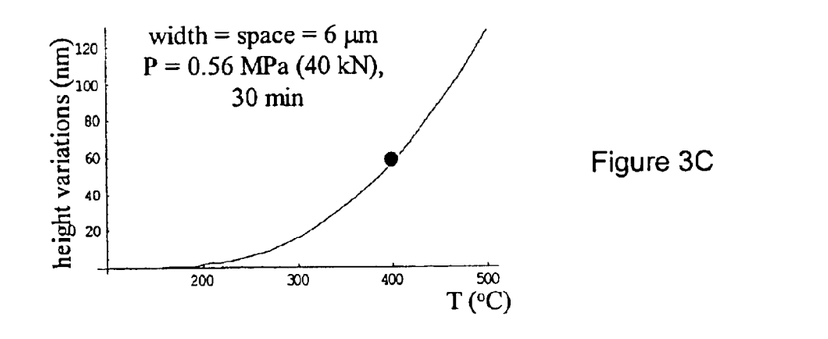

Referring to FIG. 2B, the contact substrates of FIG. 2A have been positioned immediately adjacent each other, such that two pairs of contacts (105 and 109, 108 and 112) successfully form electrical connections, while the other two pairs (106 and 110, 107 and 111) are not in contact, and in fact have visible gaps (114, 115) between pairs. Referring back to FIGS. 1C and 1D, the gapping problem can be remedied with diffusional creep if the contact protrusion variance is small enough, among other factors discussed herein. Under typical semiconductor processing conditions, such as process temperatures in the range of 200–450 degrees Celsius, most preferably about 400 degrees Celcuis, and a mild, highly distributed compressive load such as 0.5–0.6 MPa (MPa being pressure, or load per unit area, units), a maximum contact line protrusion diffusibility variance (hereinafter "maximum diffusability variance") may be defined, above which contacts with gapping are not likely to reliably close. The maximum diffusability variance increases with processing temperature and pressure, and decreases with increased contact width in a relationship substantially proportional to the inverse square of the width of the contact or contact line. FIGS. 3A–3C are illustrative of such relationships, depicting height variation, or protrusion variance, as related to pressure applied, process temperature, and contact width for a pair of contact substates similar to those depicted in FIG. 2B (100, 101) having contacts which form contact lines as viewed orthogonally, similar to those (190) comprising the structure of FIG. 10B, each of the contact lines associated with FIGS. 3A–3C having a width equal to the spacing between adjacent contact lines. The data of FIGS. 3A–3C is associated with a bonding time for the pair of substrates under the illustrated conditions of about 30 minutes.

Given such relationships, in addition to modern planarization techniques, such as chemical mechanical planarization, which are capable of accurately decreasing contact line protrusion height variance, the relationship between line protrusion height variance adjustment, contact line width, and subsequent successful contact formation using diffusional creep may be understood. For example, if a processing temperature of 400 degrees Celsius, along with a highly distributed compressive load of 0.56 MPa is to be used to encourage diffusional creep, the maximum diffusability variance relationship can be employed to determine what planarization tolerance is needed to ensure diffusivity of contacts. In such a scenario, by decreasing the line width in half, say from 4 microns to 2 microns, we can decrease the planarization tolerance needed for successful contacts diffusability by approximately four times. This is highly relevant information given the costs, time, and potential tolerances available using conventional planarization technologies such as chemical mechanical planarization.

Figure 4A:
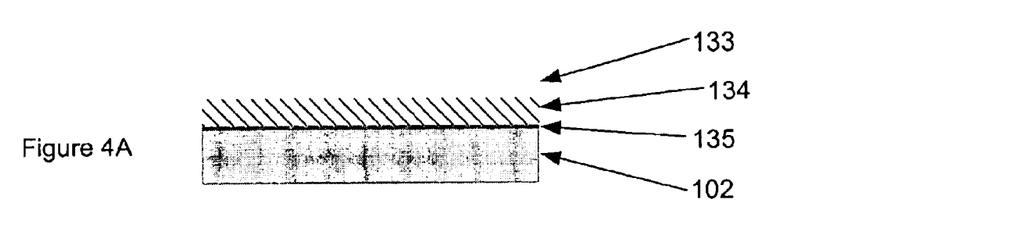
FIGS. 4A–4G depict cross sectional views of various aspects of one embodiment of the present invention.

Referring to FIGS. 4A–4G, a method to form contact substrates, such as those depicted in FIG. 2A, is illustrated. Referring to FIG. 4A, a substrate layer (102) is depicted, upon which an etch stop/barrier layer (135), dielectric layer (134), and resist layer (133) are formed. The substrate layer (102) may comprise any layer generated when making an integrated circuit, upon which a contact line or layer may be formed. The substrate layer (102) thus may comprise, for example, active and passive devices that are formed on a silicon wafer, such as transistors, capacitors, resistors, diffused junctions, gate electrodes, interconnects, etcetera. The substrate layer (102) may also comprise insulating materials (e.g., silicon dioxide, either undoped or doped with phosphorus or boron and phosphorus; silicon nitride; silicon oxynitride; or a polymer) that separate active and passive devices from the conductive layer or layers that are formed adjacent them, and may comprise other previously formed conductive layers. The etch stop/barrier layer (135) preferably comprises a material such as silicon nitride, which is conventionally utilized to isolate and protect the underlying substrate layer (102) from treatments used on layers above, such as trench formation and subsequent material deposition, and to provide etch stopping functionality by having a substantially different etch selectivity as opposed to other adjacent materials, such as those comprising the dielectric layer (134), which are to be etched using a given etch chemistry. The dielectric layer (134) may comprise a material conventionally utilized for its low dielectric constant and preferred etching properties. For example, the dielectric layer (134) may comprise silicon dioxide; silicon nitride; silicon oxynitride; carbon doped oxides; organic polymers such as polyimides, parylene, polyarylethers, organosilicates, polynaphthalenes, polyquinolines, and copolymers thereof. Examples of other types of materials that may be used to form the dielectric layer (134) include aerogel, xerogel, and spin-on-glass ("SOG"). In addition, the dielectric layer (134) may comprise hydrogen silsesquioxane ("HSQ") or methyl silsesquioxane ("MSQ"), which may be coated onto the surface of a semiconductor wafer using a conventional spin coating process. Although spin coating may be a preferred way to form the dielectric layer (134) for some materials, for others chemical vapor deposition ("CVD"), plasma enhanced chemical vapor deposition, a SolGel process, or foaming techniques may be preferred. Other suitable dielectric layer (134) materials, such as those known as "zeolites", have naturally occurring interconnected pores. While the term "zeolite" has been used in reference to many highly-ordered mesoporous materials, several zeolites are known as dielectric materials, such as mesoporous silica and aluminosilicate zeolite materials. Zeolite materials may be synthesized by an aerogel or xerogel process, spin-coated into place, or deposited using chemical vapor deposition to form a voided structure upon deposition. In the case of spin coating or other deposition methods, solvent may need to be removed using evaporative techniques familiar to those skilled in the art.

Figure 4B:
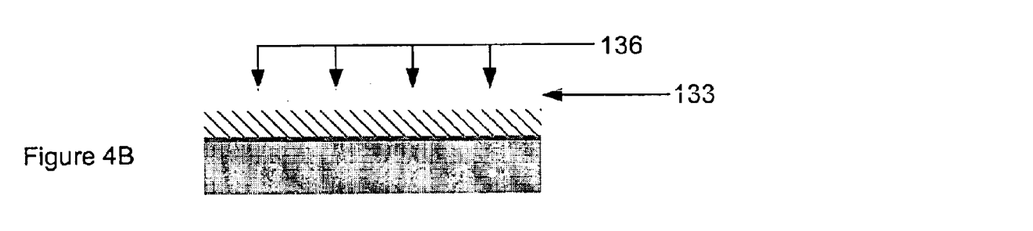
Figure 4C:
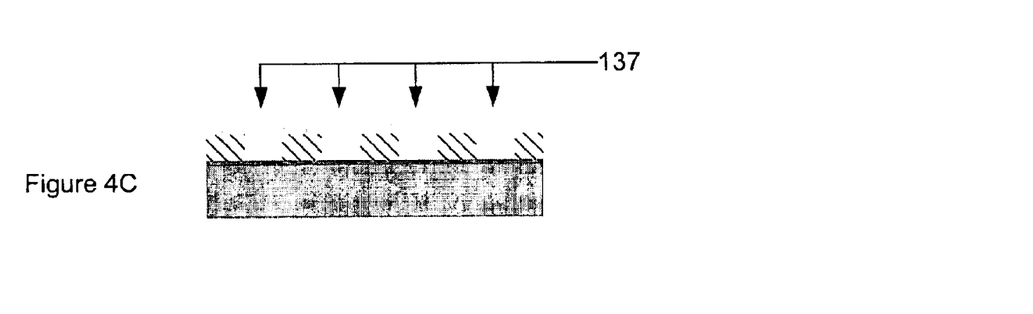
Figure 4D:
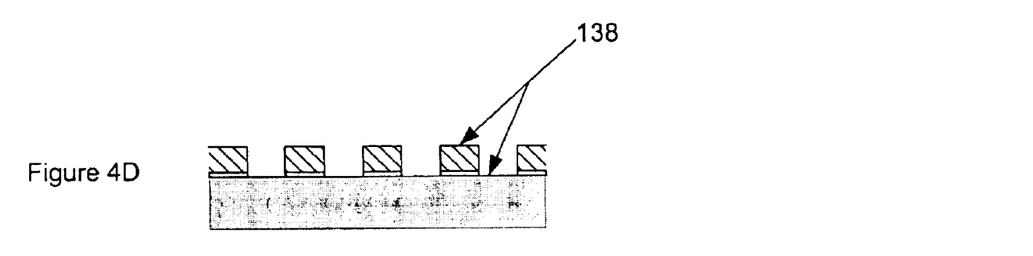

The resist layer (133) may comprise a conventional photoresist material, formed using conventional techniques such as spin-on or physical vapor deposition ("PVD"). The etch stop/barrier layer (135) also is deposited using conventional techniques, such as CVD or PVD. Referring to FIG. 4B, the resist layer (133) has been patterned by, for example, irradiation and etching, to form trenches (136) using conventional techniques. As shown in FIG. 4C, the pattern is transferred into the dielectric layer using standard etchants to form deepened trenches (137). The deepened trenches (137) preferably define substantially uniform rectangular cross sections. Referring to FIG. 4D, subsequent to removing the remaining resist material from the patterning positions and etch stop material from the trench bottoms, a barrier layer (138) may be deposited to protect existing structures from subsequent materials and treatments, such as copper electroplating. Preferred barrier layer (138) materials comprise refractory materials such as tantalum, tantalum nitride, and titanium nitride, or other materials that can inhibit diffusion from conductive layers into dielectric layers. Such barrier layers (138) preferably are formed using a conformal CVD process. Known polymeric barrier layers may also be employed, subject to the requirement that they be selected from the subgroup of polymer barrier materials which have relatively good electromigration and diffusion barrier characteristics if copper is to be used as a contact material.

Figure 4E:
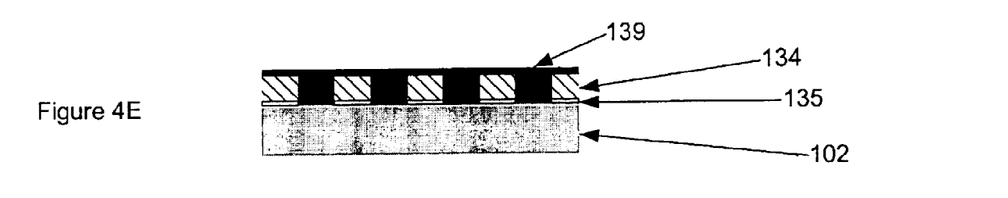
Figure 4F:
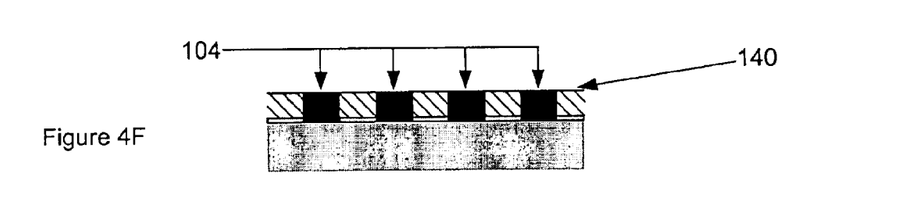
Figure 4G:
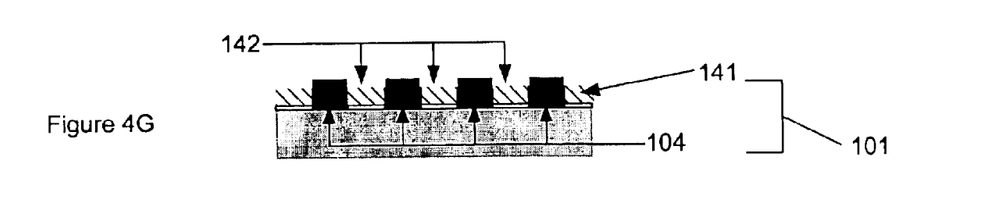

Referring to FIG. 4E, a layer of electroplated conductive material (139) is depicted. The conductive material (139), selected for favored bonding interface characteristics, preferably comprises a highly-conductive material not associated with rapid self-passivation by oxidation, such as copper, gold, and silver. Copper electroplating typically involves deposition of a copper seed layer (not shown) subsequent to deposition of the barrier layer (138). As shown in FIG. 4F, a series of discrete contacts (104) may be formed with a conventional planarization treatment, such as chemical mechanical planarization (CMP), which provides a planarized surface (140) as depicted. Each of the discrete contacts (104) preferably has a substantially uniform rectangular cross sectional profile, as illustrated in FIG. 4F, defined by a contact width, measured parallel to the planarized surface (140), and a contact height, measured perpendicular to the contact height and subsequent protrusion height. Referring to FIG. 4G, a lowered dielectric layer (141) is depicted, further exposing the series of contacts (104). The dielectric layer may be lowered, and the protrusion height variance of the contacts controlled or adjusted, from the level of the planarized contacts (104) by introducing a conventional chemical etch treatment substantially selective to the dielectric material as opposed to the material comprising the contacts (104), or may be lowered using a CMP treatment designed to remove dielectric material at a substantially greater rate than contact material is removed, such as the CMP treatments disclosed in the co-pending U.S. Patent Application for "Differential Planarization", assigned to the same assignee as the present invention. The resultant contact substrate (101), as depicted in FIG. 4G, has structural voids (142) between the contacts, which facilitate diffusional creep. Socalled "subtractive" techniques (not shown), wherein conductive material is deposited in a relatively flat layer, and then selectively removed using trenching, may also be used to produce contact substrates such as that depicted in FIG. 4G, as would be apparent to one skilled in the art.

Figure 5A:
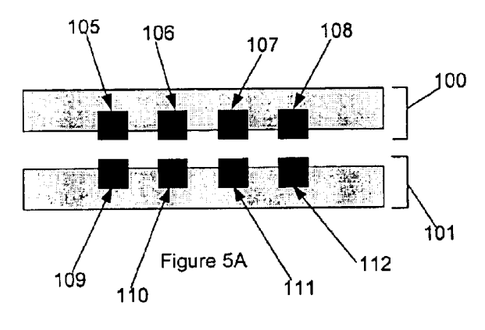
FIGS. 5A–5B depict cross sectional views of two contact substrates of an embodiment of the present invention during two phases of interfacing.
Figure 5B:
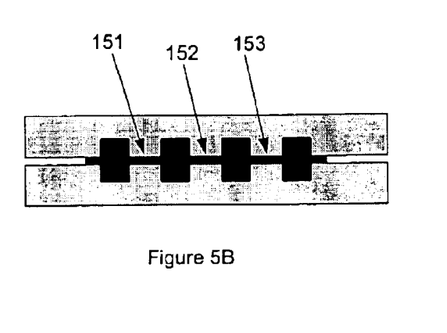
Figure 6A:
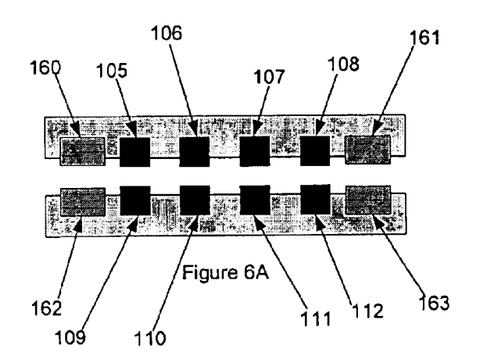
FIGS. 6A–6B depict cross sectional views of two contact substrates of an embodiment of the present invention during two phases of interfacing, the depicted embodiment incorporating a displacement limiting structure.
Figure 6B:
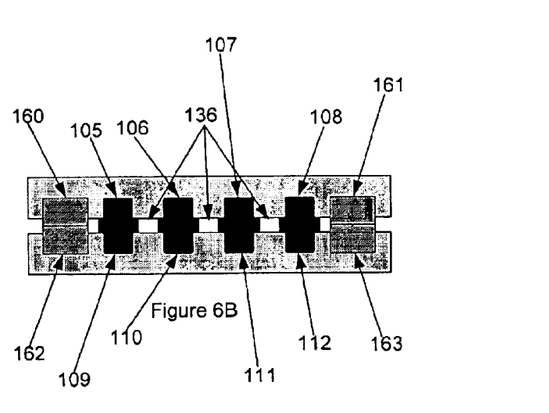
Figure 7A:
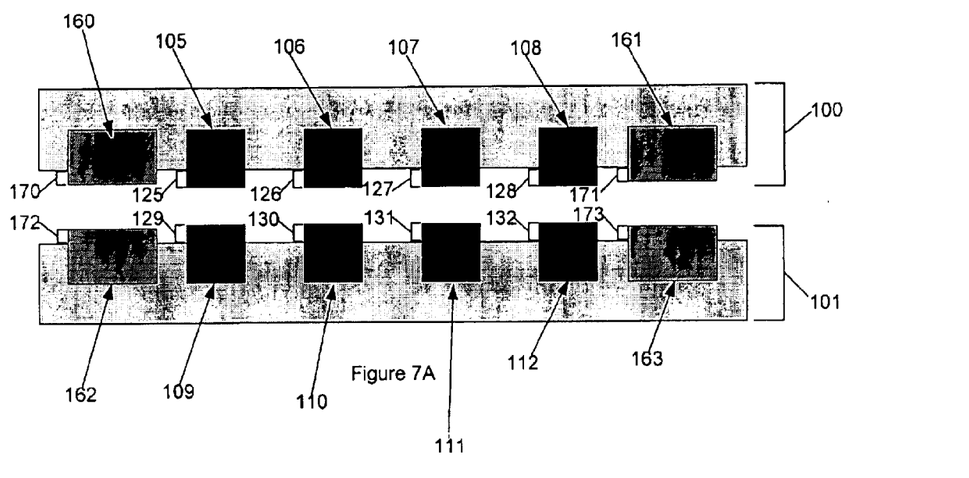
FIGS. 7A–7B depict close-up cross sectional views of two contact substrates of an embodiment of the present invention during two phases of interfacing, the depicted embodiment incorporating a displacement limiting structure.
Figure 7B:
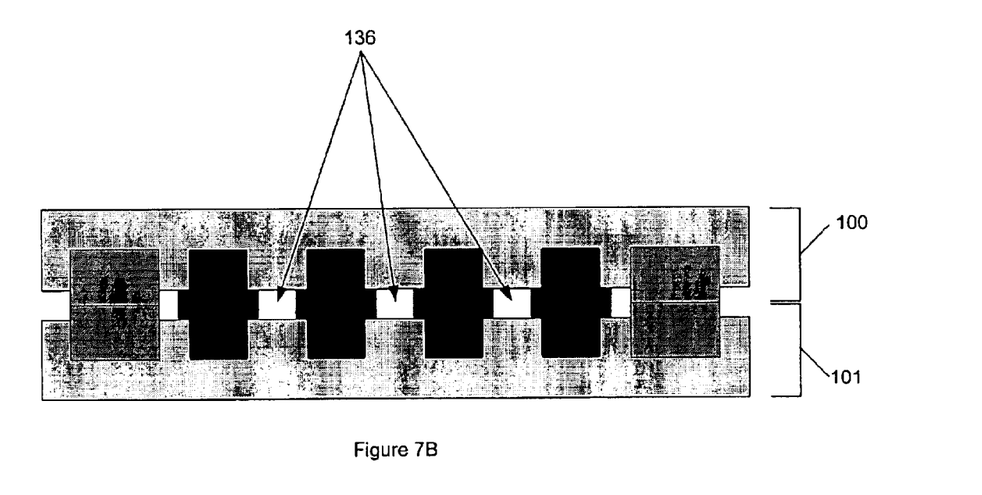

Referring to FIGS. 5A and 5B, the notion of excessive diffusional creep is illustrated. As shown in FIG. 5A, two contact substrates are positioned opposite each other, having four pairs of contacts (105 and 109, 106 and 110, 107 and 111, 108 and 112). In this example, it is assumed that the protrusion height variance of the contact lines (105–112) has been adjusted to a value less than the maximum diffusability variance given the contact width, to enable each of the contact pairings sufficient geometric opportunity for diffusional creep to close any gaps during compressing loading. FIG. 5B depicts the same structures after they have been compressed or urged together with a compressive load which is maintained for a period of time to facilitate bonding. As shown in FIG. 5B, diffusional creep has facilitated the production of shorts (151, 152, 153) in regions of relatively low stress between the contact lines, which is undesirable in this particular scenario. To avoid such "overcreep", physical stops, or displacement limiting structures (160, 161, 162, 163) may be employed, as depicted in FIG. 6A. Referring to FIG. 6B, upon compressive loading as illustrated in reference to FIG. 5B, the displacement limiting structures (160, 161, 162, 163) of the embodiment of FIG. 6B limit the amount of relative displacement between the contact substrates. FIGS. 7A and 7B provide a more detailed illustration of the displacement limiting structures of FIGS. 6A and 6B.

Referring to FIG. 7A, contact lines (105–112) and displacement limiting structures (160–163) are depicted with their protrusion heights (125–132 and 170–173, respectively). While it may be possible to have displacement limiting structures with greater average protrusion height than that of the contact lines, such is not necessarily preferred, since it may be desirable to position the displacement limiting structures to only begin to "stress shield" for the compressed contact lines after a given amount of displacement or strain. Determination of the appropriate average protrusion height is a function of the desired stress shielding scenario, as dictated by the maximum diffusability variance relationship, processing variables such as temperature and compressive pressure, and standard mechanics of materials determinations in accordance with the geometry and materials selected, as would be apparent to those skilled in the art. It is generally preferable that the protrusion height of the displacement limiting structures be lower than the average height of the contacts by about one to five times the value of "$\sigma_x$" for the contacts, and most preferably by about one to three times the value of "$\sigma_x$" for the contacts, as calculated using the aforementioned equation for "$\sigma_x^2$". Techniques for decreasing the protrusion height of displacement limiting structures relative to the protrusion heights of associated contacts are described below in reference to FIGS. 9A–9C. FIG. 7B illustrates in larger view the successfully limited diffusional creep result previously shown in FIG. 6B, wherein structural voids (136) remain intact between the pairs of contact lines.

Figure 8A:
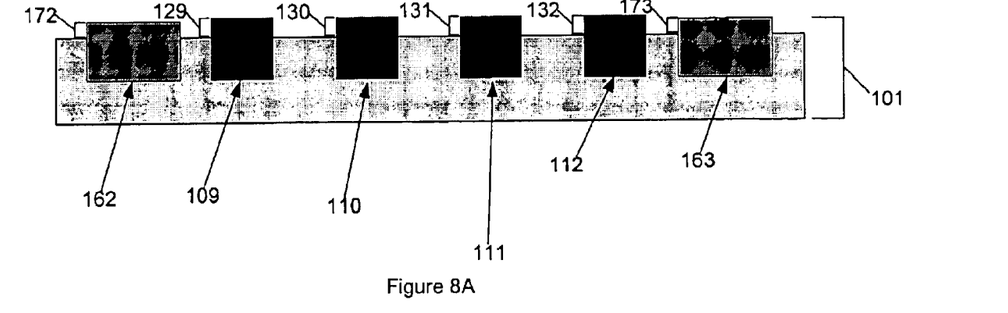
FIGS. 8A and 8B depict close-up cross sectional views of two embodiments of the present invention having different displacement limiting structures.
Figure 8B:
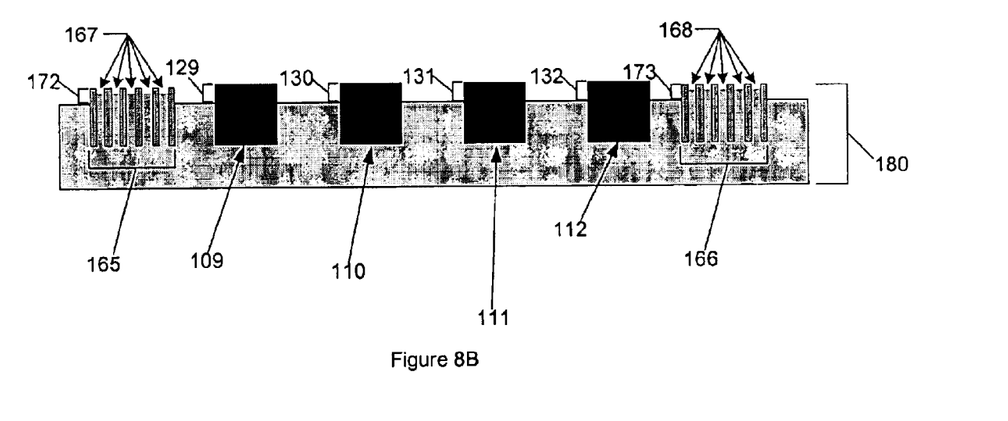

Referring to FIGS. 8A and 8B, two embodiments of contact substrates are depicted. Referring to FIG. 8A, the contact substrate (101) comprises a structure such as that depicted in FIGS. 6A and 7A, wherein the displacement limiting structures (162, 163) are discrete structures having geometries configured not to substantially deform under temperature and pressure conditions applied to encourage diffusional creep of the associated contacts (109–112), as described above. Where the materials comprising the displacement limiting structures (162, 163) are the same as the materials used for the contacts (109–112), each of the displacement limiting structures preferably is geometrically wider than each of the associated contacts (109–112) to take advantage of the relationship illustrated in FIG. 3B, for example, to avoid diffusional creep in the displacement limiting structures during process conditions configured to encourage diffusional creep of the contacts (109–112) with a similar set of contacts in an interfacing scenario, such as that depicted in FIG. 2B. In one embodiment, for example, the contacts (109–112) comprise copper and have widths less than about 6 microns, while the displacement limiting structures (162, 163) also comprise copper, and have widths greater than about 20 microns. Compressively interfacing a pair of contact substrates in accordance with this embodiment, having appropriate protrusion heights and variance as described above, along with the appropriate compressive loading and process temperature, results in a structure such as that depicted in FIG. 7B. FIG. 8B comprises two series of smaller structures, each of which collectively forms a displacement limiting structure (165, 166). The smaller structures collectively function as a larger structure in terms of limited diffusional creep as compared with associated contacts due to the decreased protrusion heights (167, 168) of the smaller structures from the underlying substrate material in between the smaller structures, as illustrated in FIG. 8B, once again taking advantage of relationships between structure width and protrusion height variance to encourage diffusional creep, such as that illustrated in FIG. 3B. A technique to form a structure similar to that of FIG. 8A is described in reference to FIGS. 9A–9C.

Figure 9A:
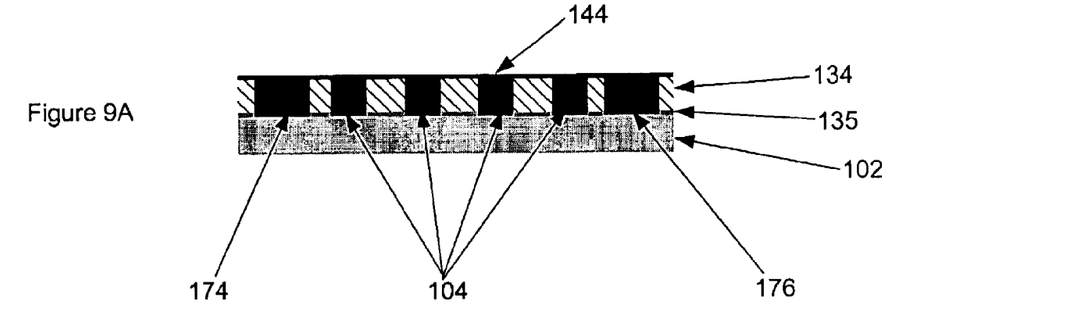
FIGS. 9A–9C depict cross sectional views of various aspects of one embodiment of the present invention.
Figure 9B:
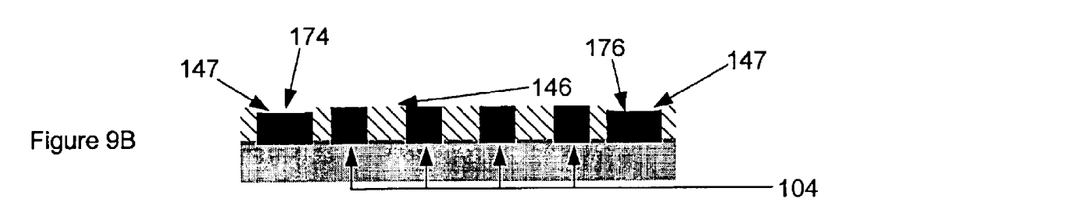

Referring to FIG. 9A, a structure is depicted having a substrate (102), etch stop/barrier layer (135), and dielectric layer (134), and layer of electroplated conductive material (144) which are similar to those depicted in FIG. 4E, with the exception that the structure of FIG. 9A has been similarly patterned, trenched, and electroplated to also have displacement limiting structures (174, 176) positioned as shown. Referring to FIG. 9B, the structure of FIG. 9A has been planarized, preferably using CMP, to form distinct contacts (104) and displacement limiting structures (174, 176) exposed in the planarized surface (146). As described above, it may be preferable to decrease the height of the displacement limiting structures (174, 176) relative to the contacts (104) to enable appropriate interfacial compressive loading, when positioned in a configuration such as that of FIG. 7B, wherein the contacts undergo compressive stress associated with a relative displacement limit between the two contact substrates (100, 101) controlled by the physical stop of the displacement limiting structures (174, 176).

A phenomena known as CMP "dishing" may be utilized to decrease the relative height of the displacement limiting structures (174, 176). Dishing typically refers to a difference in relative polishing depth associated with relatively wide structures. As described, for example, in U.S. Pat. Nos. 6,087,733, 6,103,625, 6,358,853, and 6,488,571, dishing is conventionally described as a problem for CMP procedures, since the context usually involves a desire to reach as planar a surface as possible. With relatively wide displacement limiting structures (174, 176), such as those having a width over about 20 microns, for example, as compared to associated contacts having widths less than about 6 microns, for example, CMP dishing provides variable height modification controllable mainly with polish time and slurry type, as would be apparent to one skilled in the art. The preferred difference in relative height for the displacement limiting structures (174, 176) may also be achieved using conventional local patterning and etching treatments (not shown) to selectively remove additional material comprising the displacement limiting structures (174, 176). Extra local patterning and etching treatments add complexity to the process, and therefore CMP dishing is a preferred technique for establishing a structure such as that depicted in FIG. 9B.

Figure 9C:
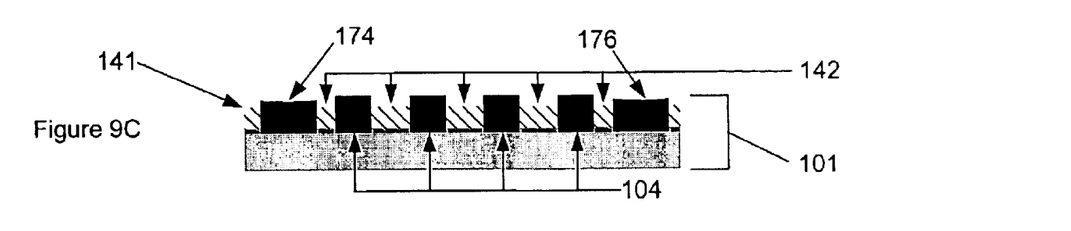

Referring to FIG. 9C, the height of the dielectric layer is decreased, preferably by selective etching as described above in reference to FIG. 4G, to form structural voids (142) between the contacts (104) and displacement limiting structures (174, 176), and appropriate protrusion heights for such structures to encourage controllable diffusional creep, in the case of the contacts (104), and to discourage diffusional creep in the displacement limiting structures (174, 176). A structure similar to that of FIG. 9C may be formed using, for example, the procedures and structures described in reference to FIGS. 4A–4G, and then separately forming displacement limiting structures, such as those depicted in FIG. 9C, adjacent the contacts (104) using localized patterning, etching, and deposition treatments, as would be apparent to one skilled in the art. Such separate forming is particularly preferred in embodiments wherein the displacement limiting structures comprise a material other than copper or a metal, such as silicon nitride or silicon dioxide.

A structure such as that depicted in FIG. 8B may be similarly formed, with the exception that the protrusion heights (129–132) of the contacts (109–112) preferably are greater than the overall protrusion heights (172, 173) of the displacement limiting structures (165, 166), which are preferably greater than the protrusion heights (167, 168) between the smaller structures which collectively comprise the displacement limiting structures (165, 166) in this embodiment. In other words, in the structure depicted in FIG. 8B, the displacement limiting structures, viewed as two entities (165, 166), protrude from a predominant level of substrate along with the contacts (109–112), the contacts (109–112) protruding from such predominant level by a greater distance than the two displacement limiting structures (165, 166). In between the subportions making up each of the depicted displacement limiting structure entities (165, 166), the substrate is at a higher level relative to the aforementioned predominant level, thereby resulting in each of the subportions having a protrusion height (167, 168) relative to this higher substrate level which preferably is less than the protrusion height (172, 173) of the displacement limiting structure entities (165, 166) relative to the predominant substrate level.

To achieve such a variation in protrusion and substrate height among these structures, the displacement limiting structures (165, 166) may be patterned and formed, subsequent to which localized etching and masking may be used to control protrusion heights from substrate materials, as would be apparent to one skilled in the art. To avoid localized etching and masking subsequent to formation of both the contacts (109–112) and the two series of smaller structures which make up the displacement limiting structures (167, 168), specialized CMP treatments may be utilized which selectively remove substrate material as a function of spacing between the pertinent structures. For example, using a CMP slurry having a particle size too large to significantly polish between the subportions of the displacement limiting structures (165, 166) of FIG. 8B, but small enough to polish between the contacts (129–132) enables a differential polishing which may be used to create and control variability in protrusion heights among the various structures, as described above. CMP techniques such as this are disclosed in the U.S. Patent Application for "Differential Planarization" assigned to the same assignee as the present invention.

Figure 10A:
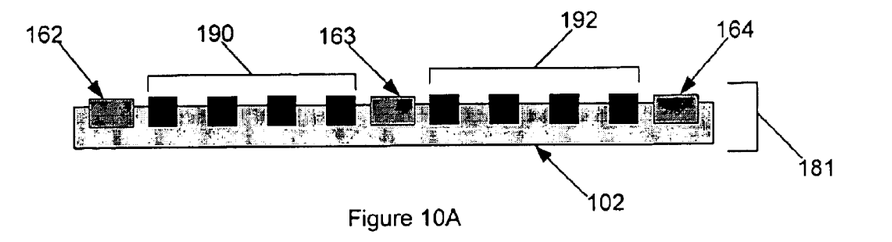
FIGS. 10A and 10B depict a cross sectional and top view, respectively of an embodiment of the present invention having displacement limiting structures.
Figure 10B:
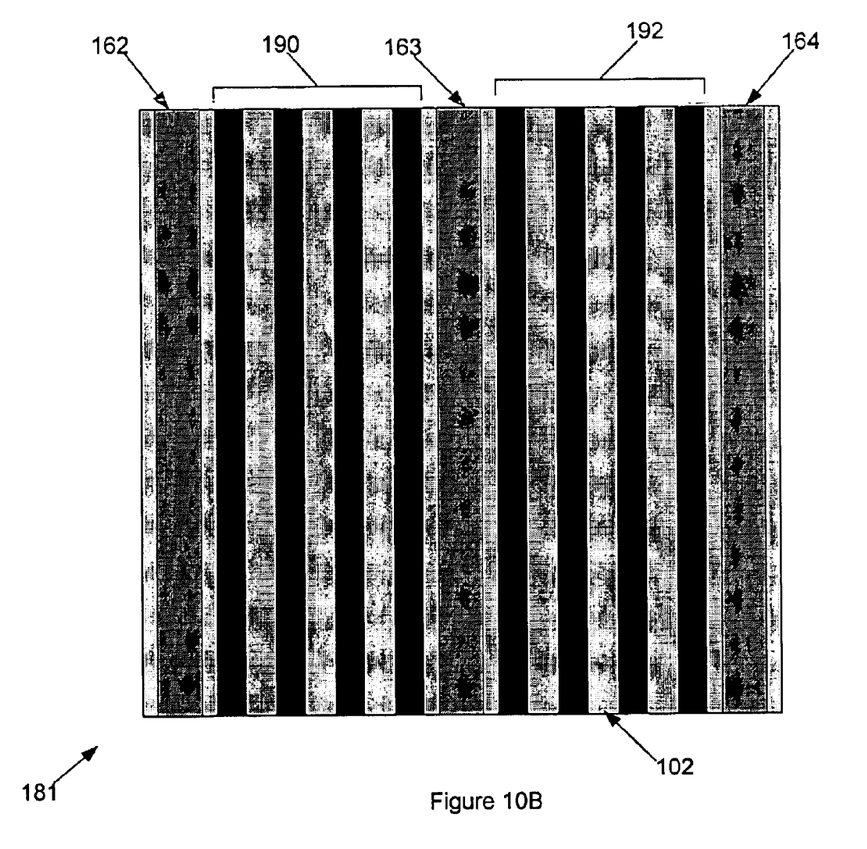
Figure 11:
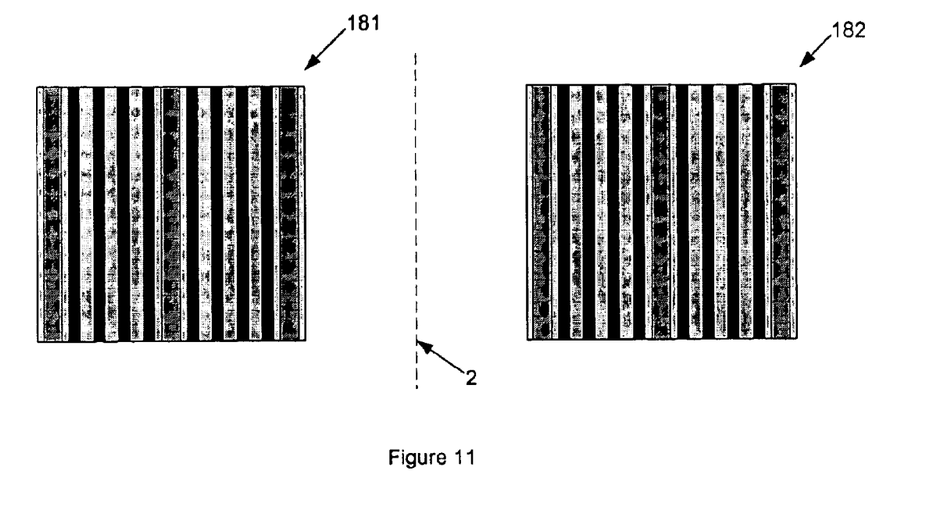
FIGS. 11, 12, and 13A depict top views of pairs of contact substrate embodiments of the present invention which may be interfaced in accordance with one aspect of the present invention.

Referring to FIGS. 10A–10B, a related embodiment is depicted in two orthogonal views. Referring to FIG. 10A, this embodiment illustrates that many configurations may be formed to take advantage of the inventive techniques described herein. The embodiment of FIG. 10A has three displacement limiting structures (162, 163, 164) between which two series of contacts (190, 192) are formed. As shown in FIG. 10B, both the displacement limiting structures (162, 163, 164) and contacts (190, 192) of this embodiment comprise continuous lines when viewed orthogonally. A contact substrate (181) such as that depicted in FIGS. 10A and 10B, may, for example, be interfaced with another similar contact substrate (182) as illustrated in FIGS. 11A–11B, and 12A–12B. Referring to FIG. 11, when the depicted contact substrates (181, 182) are sandwiched together about a vertical axis (2), they preferably have a relationship such as that structures depicted in FIGS. 7A and 7B.

Figure 12:
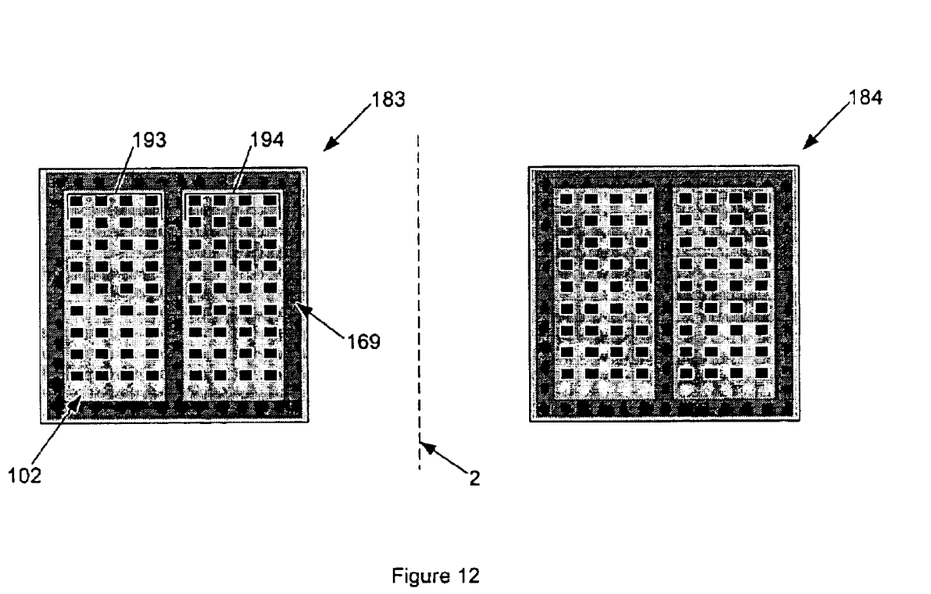
Figure 13A:
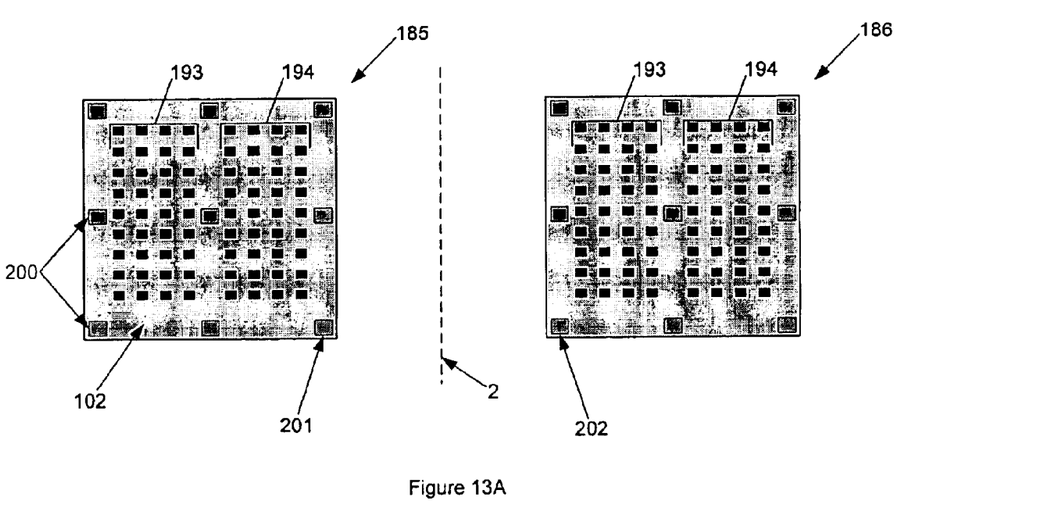

Referring to FIG. 12, two contact substrates (183, 184) may be interfaced together about a vertical axis (2) to have a preferred controlled diffusional creep relationship. Indeed, depending upon which direction a contact substrate such as those (183, 184) depicted in FIG. 12 is sectioned, it may be depicted similar to that of either FIG. 8A or 10A. As shown in FIG. 12, the displacement limiting structure (169) in this embodiment forms a perimeter around the two series (193, 194) of discrete contacts, and when interfaced with another similar contact substrate (184) about a vertical axis (2), the displacement limiting structure (169) and its counterpart function to contain diffusional creep to the local area of the contacts. In another embodiment, as shown in FIG. 13A, a contact substrate (185) having noncontinuous, or discontinuous, displacement limiting structures (200) may be dispersed about the two series of contacts (194) and interfaced with a similar contact substrate (186). Each of the contact substrates of FIG. 13A may be sectioned and viewed as illustrated in FIG. 10A, for example.

FIGS. 11–13A not only depict different views of structures similar to those previously depicted in FIGS. 1 and 2, but also illustrate that large contacts or contact lines may be subdivided or configured into geometries as prescribed herein, to take advantage of the inventive technique for assuring that electrical connections are formed between interfaced contact substrates. In another embodiment (not shown) a pair of contact substrates analogous to those of FIG. 11, 12, or 13A may be similarly interfaced, with the exception that the requisite thickness of the displacement limiting structures may be distributed unequally among the pair. For example, so long as the net thickness as interfaced is substantially equivalent, one of the pair may have a displacement limiting structure providing 40% of the thickness while the other of the pair provides 60% of the net thickness, or one of the pair may provide 100% of the net thickness while the other of the pair has no displacement limiting structure coupled to it when not interfaced.

The positioning and interfacial area of displacement limiting structures relative to contacts is a function of conventional mechanics of materials analysis and design constraints such as maximum allowable localized bending during interfacing, and area consumed by displacement limiting structures, as would be apparent to one skilled in the art. In one embodiment similar to that depicted in FIG. 8A or 8B, for example, wherein a substrate comprises a conventional semiconductor wafer and other layers are built upon the semiconductor layer to form a structure, or "stack", having a stack height, the distance between displacement limiting structures preferably is less than the equivalent of about 1 stack height to substantially limit localized bending while also preserving area for spaces, contacts, and other structures.

Figure 13B:
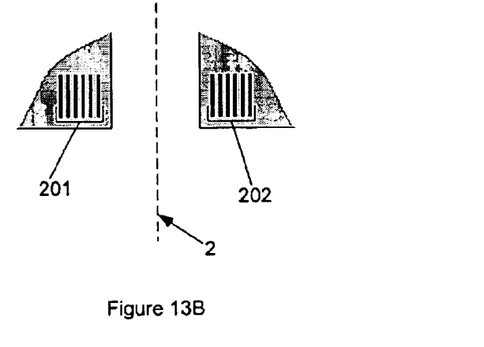
FIGS. 13B and 13C depict close-up top views of portions of pairs of contact substrate embodiments of the present invention which may be interfaced in accordance with one aspect of the present invention.
Figure 13C:
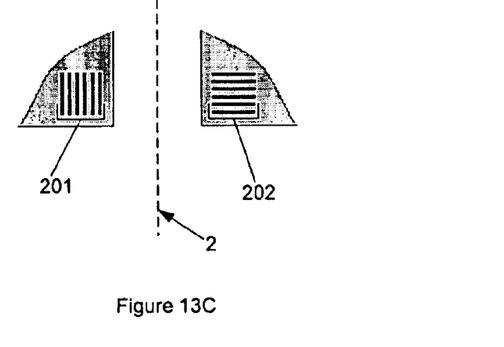

Referring to FIG. 13B, a partial close-up view of two corner displacement limiting structures (201, 202) to be interfaced, such as those depicted in smaller view in FIG. 13A, is depicted to illustrate that while the displacement limiting structures may comprise a solid geometry, as in FIG. 8A (162, 163), they may also comprise a grouping (165, 166) of smaller subportions as depicted in FIG. 8B. Where a pair of displacement limiting structures such as those depicted in FIGS. 13B and 13C (201, 202) comprises a grouping of subportions, the subportions may, for example, be oriented in a parallel configuration, as illustrated in FIG. 13B, or in a perpendicular configuration, as illustrated in FIG. 13C.

Thus, a novel interfacing solution is disclosed. Although the invention is described herein with reference to specific embodiments, many modifications therein will readily occur to those of ordinary skill in the art. Accordingly, all such variations and modifications are included within the intended scope of the invention as defined by the following claims.

What is claimed is:

1. A semiconductor structure comprising:

a first contact substrate and a second contact substrate, each comprising a plurality of contacts and a substrate surface away from which the contacts protrude at protrusion heights, the contacts comprising a conductive material and having substantially uniform rectangular cross sections defined by a contact width substantially perpendicular to the protrusion height, the contact substrates being oriented in relation to each other to facilitate interfacing at least one of the contacts of the first contact substrate against at least one of the contacts of the second contact substrate subsequent to compressive loading between the first and second contact substrates to encourage diffusional creep among the contacts;

wherein the variance of protrusion heights of all contacts is less than a maximum diffusability variance proportional to the inverse square of the contact width.

2. The semiconductor structure of claim 1 wherein the conductive material comprises a metal selected from the group consisting of copper, gold, and silver.

3. The semiconductor structure of claim 1 wherein the contacts of each contact substrate do not directly contact each other.

4. The semiconductor structure of claim 3 wherein the contacts are separated from each other by structural voids.

5. The semiconductor structure of claim 1 wherein the contacts of each contact substrate form contact lines which are substantially parallel with each other.

6. The semiconductor structure of claim 1 wherein the contacts of each contact substrate occupy substantially the same plane.

7. The semiconductor structure of claim 5 wherein the contact substrates are oriented with the parallel contact lines of the first contact substrate substantially parallel to the parallel contact lines of the second contact substrate.

8. The semiconductor structure of claim 4 further comprising a displacement limiting structure disposed between the two contact substrates having net height, as measured in a direction perpendicular to a plane substantially parallel to the two contact substrates, sufficient to limit relative displacement between the two contact substrates subsequent to compressive loading therebetween.

9. The semiconductor structure of claim 8 wherein the displacement limiting structure forms a perimeter around the contacts of at least one of the first and second contact substrates.

10. The semiconductor structure of claim 9 wherein the displacement limiting structure has a substantially uniform rectangular cross section defined by a line height, along the direction of the net height measurement, and a line width, in a perpendicular direction.

11. The semiconductor structure of claim 10 wherein the line comprises a nonmetal.

12. The semiconductor structure of claim 11 wherein in the nonmetal comprises silicon nitride.

13. The semiconductor structure of claim 10 wherein the displacement limiting structure and contacts comprise the same metal.

14. The semiconductor structure of claim 13 wherein the line width of the displacement limiting structure is greater than the average width of the contacts.

15. The semiconductor structure of claim 8 wherein the displacement limiting structure comprises first and second portions, the first portion being coupled to the first contact substrate and the second portion being coupled to the second contact substrate, the first and second portions being oriented to contact each other during compressive loading between the first and second contact substrates.

16. The semiconductor structure of claim 10 wherein the variance of line height is greater than a second maximum diffusability variance proportional to the inverse square of the line width, to prevent diffusability of the displacement limiting structure.

17. A method to join contacts between interfaced devices comprising:

adjusting the protrusion height variance of contacts, which comprise two contact substrates, to a value less than a maximum diffusability variance associated with the contact width and material comprising the contacts;

urging the two contact substrates toward each other with a compressive load, the compressive load leaving at least a portion of the contacts in compression against each other; and maintaining the compressive load to facilitate diffusional creep between contacts of the two opposing contact substrates.

18. The method of claim 17 wherein urging the two contact substrates comprises compressing the contact substrates toward each other until a displacement-limiting structure provides a physical stop to limit compressive load and relative displacement.

19. The method of claim 17 further comprising substantially containing diffusion associated with diffusional creep of the contacts to a volume defined by the two contact substrates and a perimeter structure disposed around the contacts and between the two contact substrates.

20. The method of claim 17 wherein the contacts comprise a metal selected from the group consisting of copper, gold, and silver.

21. The method of claim 20 wherein the maximum diffusability variance is proportional to the inverse square of the contact width.

22. The method of claim 17 wherein adjusting the protrusion height variance of contact lines comprises planarizing at least one of the contact substrates.

23. The method of claim 17 wherein urging the two contact substrates toward each other comprises applying a highly-distributed load across at least one of the two contact substrates.

24. The method of claim 20 wherein the compressive load comprises about 40 kN.

25. The method of claim 17 further comprising heating the two contact substrates to a diffusion processing temperature.

26. The method of claim 25 wherein the contact lines comprise copper, and the diffusion processing temperature is about 400 degrees Celcius.

* * * * *